(12) United States Patent
Mastromatteo et al.

(10) Patent No.: US 7,141,871 B2
(45) Date of Patent: Nov. 28, 2006

(54) METHOD FOR MANUFACTURING ENCAPSULATED OPTO-ELECTRONIC DEVICES AND ENCAPSULATED DEVICE THUS OBTAINED

(75) Inventors: Ubaldo Mastromatteo, Bareggio (IT); Andrea Pallotta, Milan (IT); Pietro Montanini, Milan (IT); Francesco Martini, Alzate Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/924,014

(22) Filed: Aug. 23, 2004

(65) Prior Publication Data
US 2005/0093013 A1 May 5, 2005

Related U.S. Application Data

(63) Continuation of application No. 10/820,460, filed on Apr. 8, 2004, now abandoned.

(30) Foreign Application Priority Data
Apr. 11, 2003 (IT) .......................... TO2003A0284

(51) Int. Cl.
*H01L 23/02* (2006.01)
(52) U.S. Cl. .................. 257/680; 257/678; 385/94; 385/83

(58) Field of Classification Search ................ 257/678, 257/680
See application file for complete search history.

(56) References Cited

U.S. PATENT DOCUMENTS

| | | | | |
|---|---|---|---|---|
| 6,318,910 | B1 * | 11/2001 | Higashikawa | 385/94 |
| 6,467,972 | B1 * | 10/2002 | Setoguchi | 385/88 |
| 6,585,427 | B1 * | 7/2003 | Finot et al. | 385/92 |
| 6,739,764 | B1 * | 5/2004 | Ido et al. | 385/92 |
| 6,883,977 | B1 * | 4/2005 | Dautartas et al. | 385/92 |
| 2001/0017964 | A1 * | 8/2001 | Setoguchi | 385/88 |

* cited by examiner

*Primary Examiner*—Evan Pert
*Assistant Examiner*—Victor A. Mandala, Jr.
(74) *Attorney, Agent, or Firm*—Lisa K. Jorgenson; James H. Morris; Wolf, Greenfield & Sacks, P.C.

(57) ABSTRACT

A packaging structure for optoelectronic components is formed by a first body, of semiconductor material, and a second body, of semiconductor material, fixed to a first face of said first body. A through window is formed in the second body and exposes a portion of the first face of the first body, whereon at least one optoelectronic component is fixed. Through connection regions extend through the first body and are in electrical contact with the optoelectronic component. The through connection regions are insulated from the rest of the first body via through insulation regions. Contact regions are arranged on the bottom face of the first body and are connected to said optoelectronic component via the through connection regions.

13 Claims, 5 Drawing Sheets

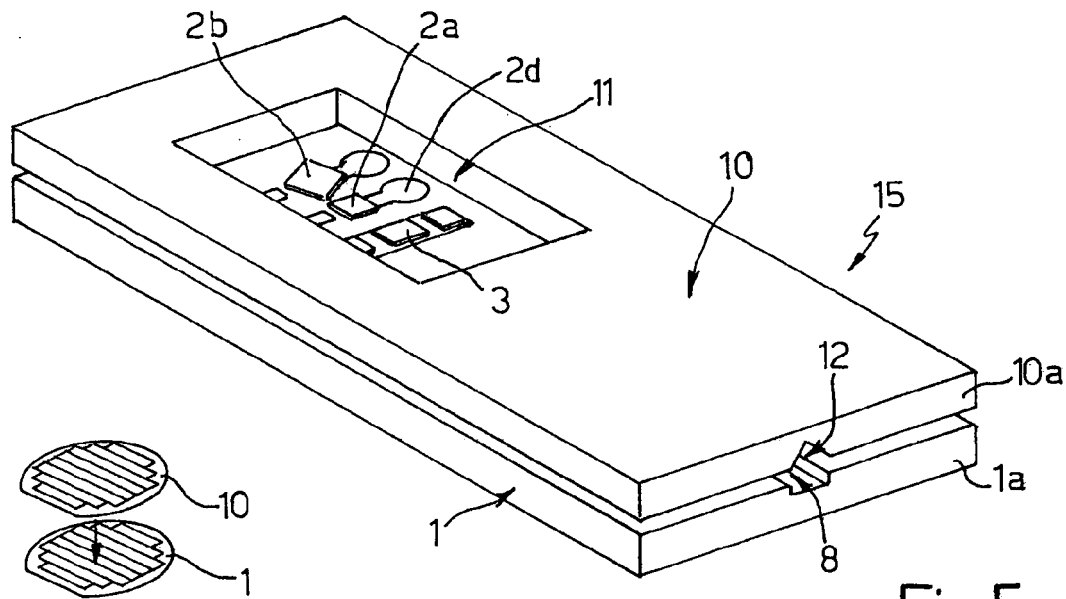
Fig.4
Fig.5
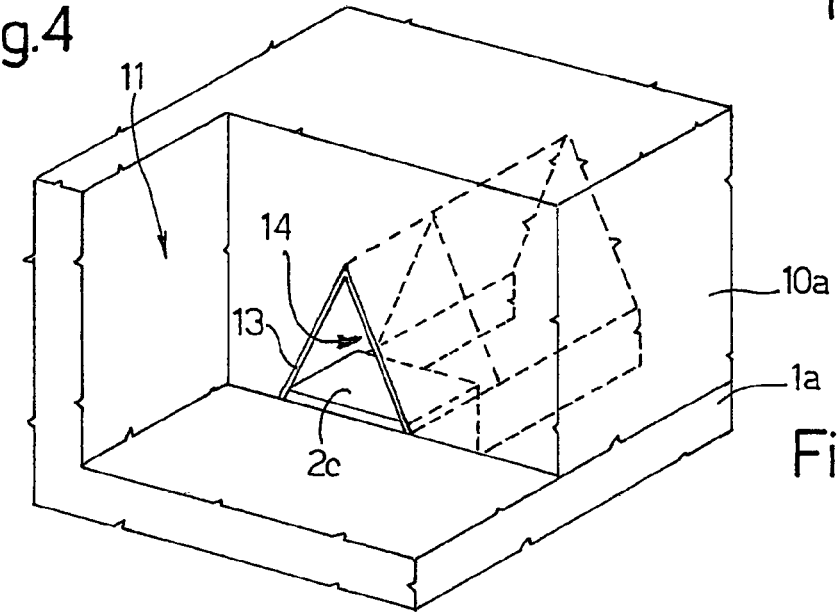
Fig.6
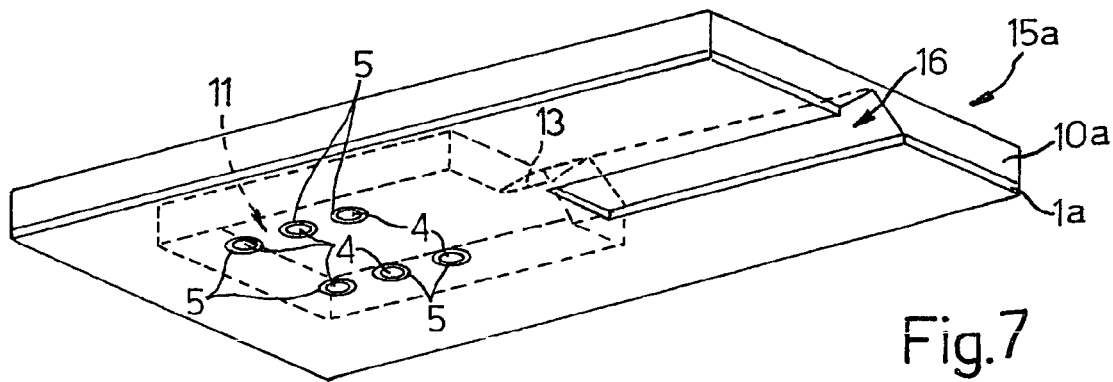
Fig.7

METHOD FOR MANUFACTURING ENCAPSULATED OPTO-ELECTRONIC DEVICES AND ENCAPSULATED DEVICE THUS OBTAINED

This application is a continuation of U.S. application Ser. No. 10/820,460 entitled Method For Manufacturing Encapsulated Opto-Electronic Devices And Encapsulated Device Thus Obtained filed on Apr. 8, 2004, now abandoned, which is herein incorporated by reference in its entirety.

BACKGROUND OF THE INVENTION

1. Field of the Invention

The present invention relates to a method for manufacturing encapsulated optoelectronic devices and to the encapsulated device thus obtained.

2. Discussion of the Related Art

As is known, optoelectronic devices for applications with high transmission rate ($\geq 2.5$ Gb/s) are packaged using ceramic-multilayer technology. Different layers of ceramic material are processed separately using metallization processes to obtain electrical connection lines, using punching processes to obtain dug-out areas and openings, and metal filling processes to form through paths for electrically connecting the ceramic layers. Then, after a lamination step, the various layers are overlaid, aligned and bonded to one another via a process carried out in an oven at high temperature (T>1000° C.).

Thus, a single multilayer monolithic block is obtained, having the desired structure formed by metallized via holes, electrical connection lines buried between the various ceramic layers and surface lines, as well as appropriate cavities for inserting the optical and electronic components. If so required, the structure of ceramic material enables, through a high temperature brazing process, the final structure of the packaging to be obtained with metal rings for welding the cover or with pins for electrical connection, which are compatible with surface mounting (SMD) or insertion (DIP) on printed circuit boards (PCB).

The known devices have some drawbacks.

In fact, optoelectronic transducer components, i.e., semiconductor laser diodes and the PIN or APD receiving photodiodes, require a carrier substrate of an appropriate material (the so-called "carrier submount") or "Optical SubAssembly"—OSA), having the triple function of:

1. enabling preliminary characterization of the operation of the transducer from the electrical and optical standpoints prior to insertion thereof within the packaging structure (which is hermetic in the case of the laser transmitter);

2. enabling alignment and subsequent fixing of the optical fiber; and 3. enabling the heat generated by the laser source to be dissipated efficiently.

The above carrier submount is therefore a further component which, once the constituent material has been chosen, needs to be appropriately designed, constructed and handled.

In addition, in the step of selecting the material forming the carrier submount, the differences between the coefficients of thermal expansion between the carrier submount and the package must be taken into account so as to minimize the mechanical stresses induced by heat, which can cause micrometric displacements of the optical fiber with respect to the laser and the photodiode, so deteriorating the overall performance of the entire optical transmitter or receiver module.

In addition, in the step of designing the carrier submount with the respective system for fixing the optical fiber, in applications at high bit rate ($\geq 2.5$ Gb/s), it is essential to ensure that the electrical connections between the carrier submount and the package will have the necessary characteristics of maximum transmission coefficient and minimum electrical reflection coefficient. This optimization is obtained by reducing to the minimum the parasitic electrical parameters (distributed capacitances and inductances), i.e., by minimizing the most critical electrical paths, including ground and supply paths.

Finally, the presence of a carrier submount and of a hermetic sealing package, causing the final transmitter or receiver module to be more complex, involves a cost increase for development, assembly and production of the finished device.

SUMMARY OF THE INVENTION

One aim of the present invention is to overcome the drawbacks described above, eliminating the need for two distinct systems (ceramic package and carrier submount).

According to one embodiment of the present invention, there is provided an encapsulated optoelectronic device, comprising a first body, of semiconductor material, having a first and a second face; a second body, of semiconductor material, fixed to said first face of said first body; a through window formed in said second body and exposing a portion of said first face of said first body; at least one optoelectronic component fixed to said first body within said window; first through connection regions extending through said first body from said first to said second face and in electrical contact with said optoelectronic component; insulation regions surrounding said first through connection regions; and first contact regions extending on said second face of said first body and connected to said optoelectronic component through said through connection regions.

According to an embodiment of the present invention, said second body has a fiber housing groove extending from a side surface external to said window for housing an optical fiber.

According to an embodiment of the present invention, said optoelectronic component comprises a laser device facing one end of said optical fiber.

According to an embodiment of the present invention, said first body has a first metal region, and said fiber housing groove has a second metal region arranged next to said window, at least partially facing said first metal region and forming with said first metal region a pseudo-ferrule.

According to an embodiment of the present invention, a metal material is housed in and hermetically seals said pseudo-ferrule.

According to an embodiment of the present invention, said first body has a through channel facing said groove and forming a prolongation of said groove.

According to an embodiment of the present invention, said through channel is closed with sealing material.

According to an embodiment of the present invention, the optoelectronic device further comprises a resistive region extending on said first face of said first body and carrying welding material, said resistive region being connected to second contact regions formed on said second face via second through connection regions.

According to an embodiment of the present invention, a cover of semiconductor material is bonded to said second body and hermetically closes said window.

According to an embodiment of the present invention, a method for manufacturing an encapsulated optoelectronic device, comprises providing a first wafer, of semiconductor material, having a first face and a thickness; forming insulation regions extending from said first face of said first wafer for a portion of said thickness and surrounding through connection regions; providing a second wafer of semiconductor material; forming a through window through said second wafer; bonding said second wafer to said first face of said first wafer; thinning said first wafer until reaching said insulation regions, thereby said first wafer has a second face and said through connection regions extend between said first face and said second face; forming first contact regions on said second face of said first wafer in electrical connection with said through connection regions; fixing, on said first face of said first wafer and through said window, at least one optoelectronic component; and electrically connecting said optoelectronic component to said through connection regions.

According to an embodiment of the present invention, the method comprises, prior to bonding said second wafer, the step of forming, in said second wafer, a fiber housing groove extending from said window, and, after said step of thinning, the step of cutting said first and second wafers to obtain at least one package, thereby said fiber housing groove extends from a side surface of said package.

According to an embodiment of the present invention, the method comprises the step of inserting an optical fiber in said fiber housing groove, after said step of cutting.

According to an embodiment of the present invention, the method comprises, prior to inserting an optical fiber, the step of forming, in said first wafer, a passage facing said fiber housing groove and forming a prolongation of said groove.

According to an embodiment of the present invention, said step of forming a passage comprises, prior to bonding, the step of forming an access groove in said first wafer for said thickness portion, wherein said step of bonding comprises aligning said access groove to said fiber housing groove, and said step of thinning comprises removing said semiconductor material of said first wafer underneath said access groove.

According to an embodiment of the present invention, the method comprises, prior to said step of bonding, the steps of forming a first metal region on said first face and forming a second metal region in said fiber housing groove next to said window, and wherein said step of bonding comprises aligning said first and said second wafer thereby said second metal region at least partially faces said first metal region and forms a pseudo-ferrule with said first metal region.

According to an embodiment of the present invention, the method comprises the step of inserting hermetic sealing metal material in said pseudo-ferrule, after said step of inserting an optical fiber.

According to an embodiment of the present invention, the method comprises, prior to said step of bonding, forming a resistive region on said first face connected to second contact regions formed on said second face via second through connection regions formed in said first wafer, and laying welding material on top of said resistive region.

According to an embodiment of the present invention, the method comprises, after said step of laying welding material, the steps of: introducing an optical fiber in said fiber housing groove; seeking a maximum power position for said optical fiber; heating said welding material through said resistive region; and fixing said optical fiber in position.

According to an embodiment of the present invention, a method for manufacturing a package for an optoelectronic component, is provided, comprising providing a first wafer of semiconductor material, having a first face and a thickness; forming insulation regions extending from said first face of said first wafer for a portion of said thickness and surrounding through connection regions; providing a second wafer of semiconductor material; forming a through window through said second wafer; bonding said second wafer to said first face of said first wafer; thinning said first wafer until reaching said insulation regions, thereby said first wafer has a second face and said through connection regions extend between said first face and said second face; and forming first contact regions on said second face of said first wafer in electrical connection with said through connection regions.

According to one aspect of the present invention, a system is described for multilayer silicon packaging, wherein the package and the submount carrying the optoelectronic transducer (with fixed and aligned optical fiber) forms a single monolithic block made of a single material and provided with electrical connections to an underlying body.

According to another aspect of the invention, through holes are provided for electrically connecting a metallization inside the package to a metallization formed on the bottom surface of the package. To this end, through openings are provided and filled with silicon oxide that surround regions of a more or less cylindrical shape, that are made of heavily doped silicon and thus have a high electrical conductivity. The doped silicon regions are thus able to provide electrical connection between the metallizations on the top and bottom surfaces of the cylindrical regions of doped silicon.

According to yet a further aspect of the invention, two wafers of semiconductor material are bonded together at room temperature—after appropriate chemical preparation of the contact surfaces, obtained by oxidizing monocrystalline silicon and hence having minimal surface roughness—according to a known technique of wafer bonding, for example, by covalent bond at room temperature.

BRIEF DESCRIPTION OF THE DRAWINGS

For a better understanding of the invention, an embodiment thereof is now described, purely by way of non-limiting example and with reference to the attached drawings, wherein:

FIGS. 1 to 14 are views of portions of semiconductor wafers, in different manufacturing steps in accordance with the invention.

DETAILED DESCRIPTION

The following description refers to the method for manufacturing a structure for packaging and aligning a laser to an optical fiber for obtaining a hermetic optoelectronic transmitter device. Similar considerations apply, however, to the manufacture of an optoelectronic receiver device, comprising a photodiode coupled to an optical fiber, wherein hermetic packaging is not required, and generally the process is simpler, as appears from the following.

Initially, a first and a second wafers 1, 10 to be bonded are processed. The wafers 1, 2 are of conductive material, typically monocrystalline silicon, and standard thickness.

Figure 1:
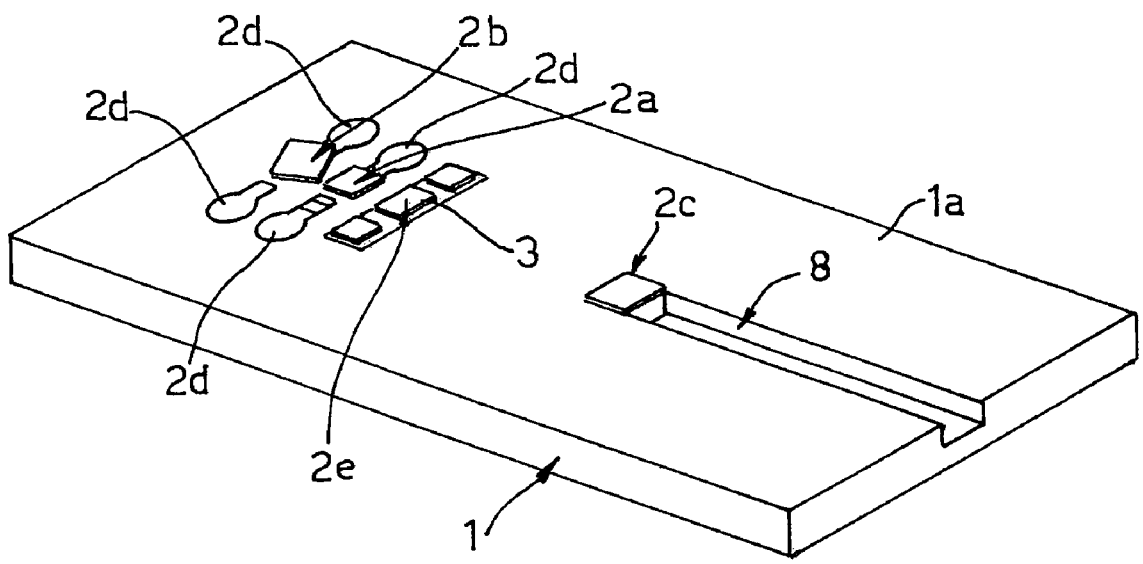

FIG. 1 illustrates a perspective view of a portion 1a of the first wafer 1. The first wafer 1 has already undergone preliminary processing steps, for obtaining, in each portion 1a, metal regions and a groove, and for defining through contact regions, illustrated in detail in FIG. 2.

The metal regions comprise a first pad 2a, of circular shape, for connecting and welding a laser device; a second pad 2b, of circular shape, for connecting and welding a monitoring photodiode; a resistor 3 of chrome, and a welding region 2e overlying the resistor 3, for welding the end of an optical fiber, a first metal region 2c used subsequently for fixing an optical fiber and hermetically sealing the structure; and contact regions 2d for enabling electrical connection of the components to the back of the wafer, after thinning the first wafer 1, as explained hereinafter.

The pads 2a, 2b, the first metal region 2c, the contact regions 2d, and the welding region 2e are preferably of AuSn; the contact regions 2d are connected to the pads 2a, 2b via short metal paths.

Figure 2:
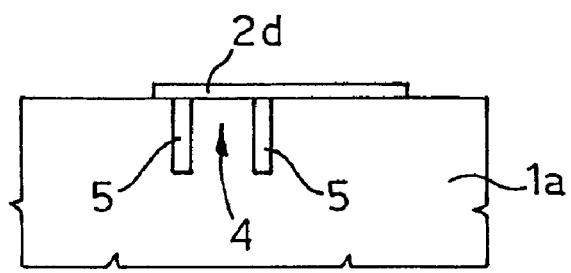

The contact regions 2d are arranged on top of silicon portions 4 of the first wafer 1 designed to form through contact regions, as illustrated for a silicon portion 4 in the cross-section of FIG. 2. In detail, the portion of silicon 4 is laterally delimited by an insulation region 5 of annular shape, which, after thinning the first wafer 1, electrically insulates the silicon portion 4 from the rest of the first wafer 1. The silicon portions 4 may be heavily doped so as to present high electrical conductivity.

The structure of FIG. 2 is obtained by digging annular areas in the first wafer 1 prior to forming the metal regions 2a–2d and 3 and by filling these annular areas with insulating material, as described in U.S. patent application Ser. No. 10/055,029, filed Jan. 22, 2002 and published as U.S. Publication No. 2002/0123160 A1 and U.S. patent application Ser. No. 10/406,633, filed Apr. 2, 2003 and published as U.S. Publication No. 2003/0222354, which is incorporated herein by reference. While forming the annular dug-out areas, a first groove 8 is also formed that extends from the first metal region 2c towards the perimeter of the chip obtained after cutting of the first wafer. The first groove 8 hence has the same depth as the insulation regions 5, for example, 50 μm.

Figure 3:
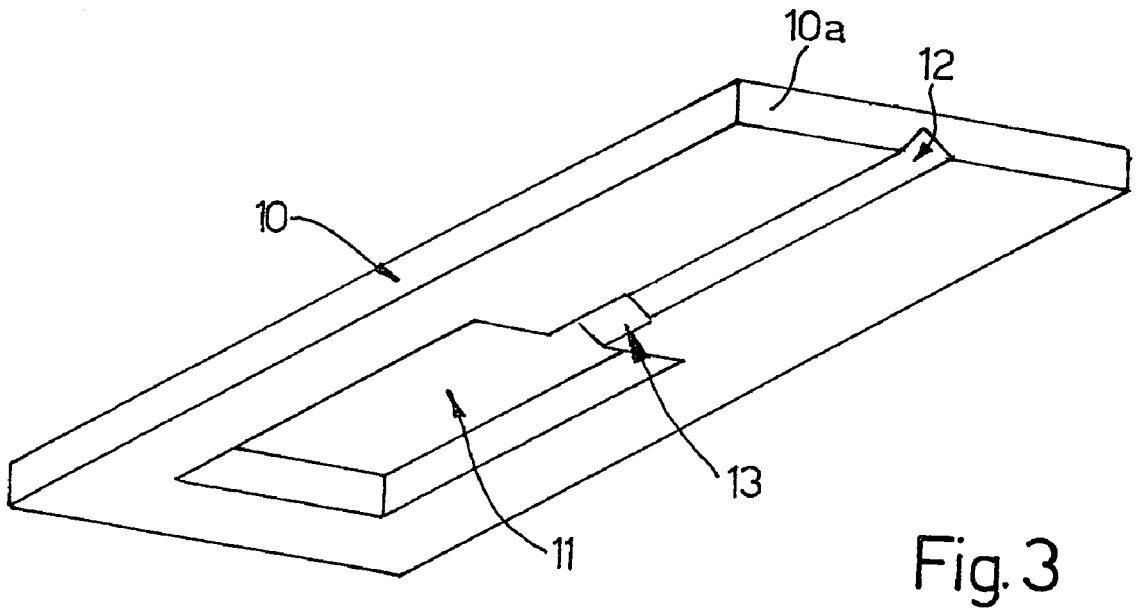

A second wafer 10 is then arranged on top of the first wafer 1. The second wafer 10 has also undergone preliminary processing steps, as illustrated in FIG. 3 for a portion 10a corresponding to the portion 1a of the first wafer 1 of FIG. 1 and thus designed to be arranged exactly on top of the portion 1a.

In particular, the portion 10a of the second wafer 10 has a through out window 11 and a second groove 12, which extends from the window 11 up to the edge of the portion 10a.

The window 11 is sized and positioned in such a way that, after the second wafer 10 has been arranged on top of the first wafer 1, it enables access to the metal regions 2a–2d and 3. The second groove 12 has preferably a triangular cross-section and is arranged so as to be set on top of the first groove 8. Preferably, the second groove 12 is slightly longer than the first groove 8 so as to cover also the first metal region 2c, after the wafers 1 and 10 have been overlaid, as explained in greater detail hereinafter.

The second groove 12 is coated with a second metal region 13 next to its internal end facing the window 11; the second groove 12 being longer than that of the first metal region 2c, for example by 1 mm.

The first and second wafers can moreover be provided with structures and/or layers designed for mutual bonding; for example, one of the two wafers may be provided with metal regions for direct bonding to the silicon of the other wafer, or both of the wafers may have a surface layer of silicon oxide, for mutual bonding at low temperature, according to any of the techniques known to the person skilled in the art.

The second wafer 10 is then turned upside down, aligned and bonded to the first wafer 1, as illustrated in FIG. 4 at wafer level and in FIG. 5 for the portions 1a and 10a, thus forming a composite wafer 15 made up of a plurality of composite portions 15a. Consequently, in the composite portion 15a, the second groove 12 is aligned with and faces the first groove 8, and the metal regions 2a–2b, 2d and 3 face the window 11. The first metal region 2c faces, instead, the second metal region 13, as illustrated in the perspective view of the detail illustrated in FIG. 6, and forms therewith a pseudo-ferrule 14.

Next, the first wafer 1 is thinned by lapping from the back. The thinning operation proceeds until reaching the insulation regions 4 and the first groove 8, as illustrated in the perspective view from below of FIG. 7. As may be noted, the grooves 8 and 14 now form a channel 16, which is accessible from below, while the silicon portions 4 now form through paths (designated once again by 4 in FIG. 7, for simplicity), which are completely insulated by the insulation regions 5.

Figure 8:
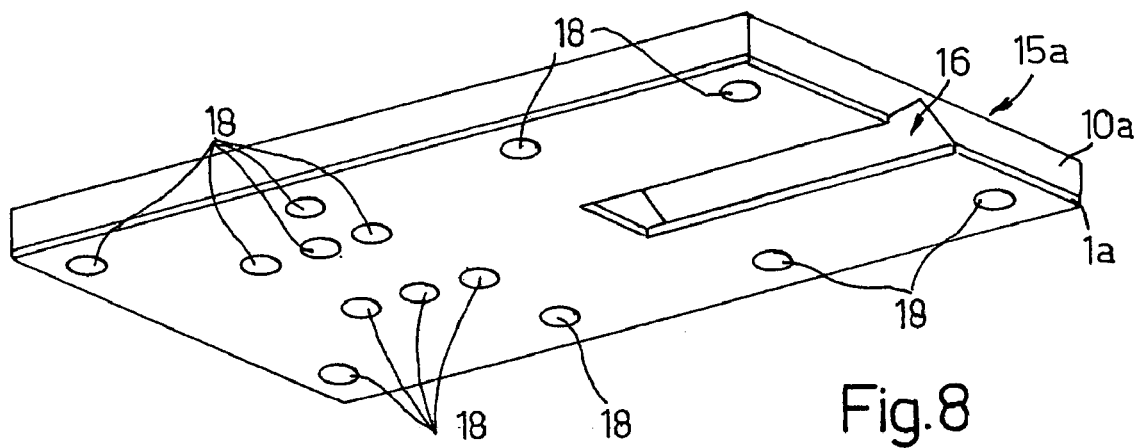
Figure 9:
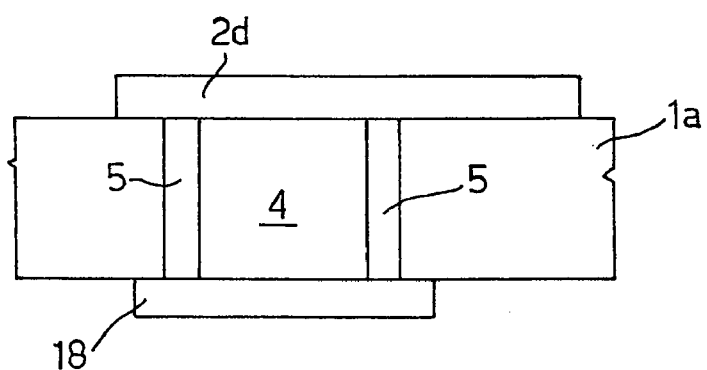

Then (FIG. 8), the bottom surface of the first wafer 1, formed after thinning, is metallized to form rear contact regions 18 at, i.a., the through paths 4, as illustrated in detail in the cross-section of FIG. 9.

Next, the required components are welded through the windows 11. In the considered example (FIG. 10), a laser device 19 is welded to the metal region 2a (FIG. 1), and a monitoring photodiode 20 is welded to the metal region 2b. Welding is carried out preferably by remelting of AuSn at approximately 300° C.

Figure 10:
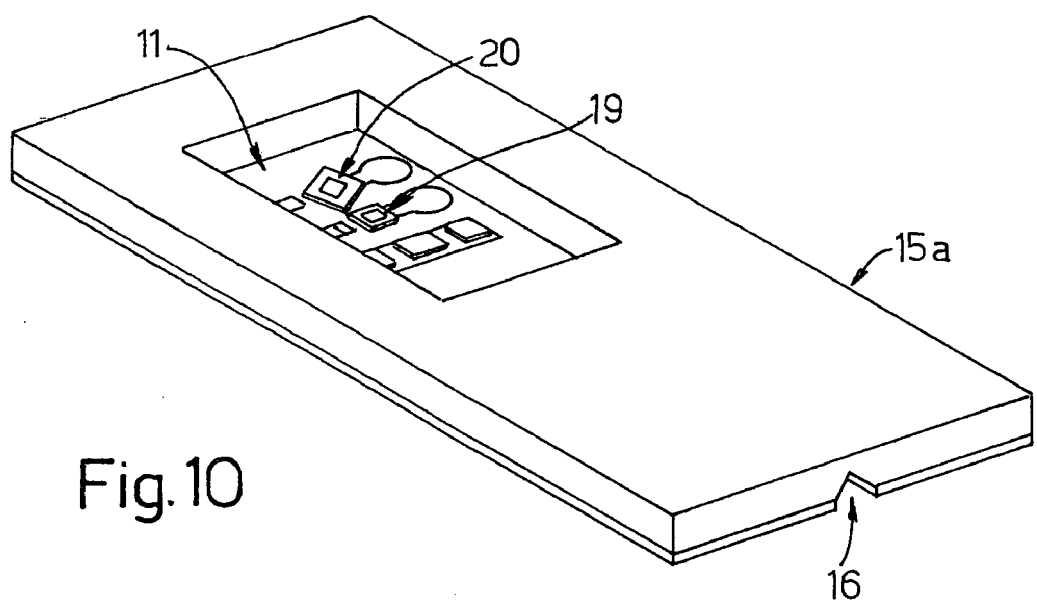
Figure 11:
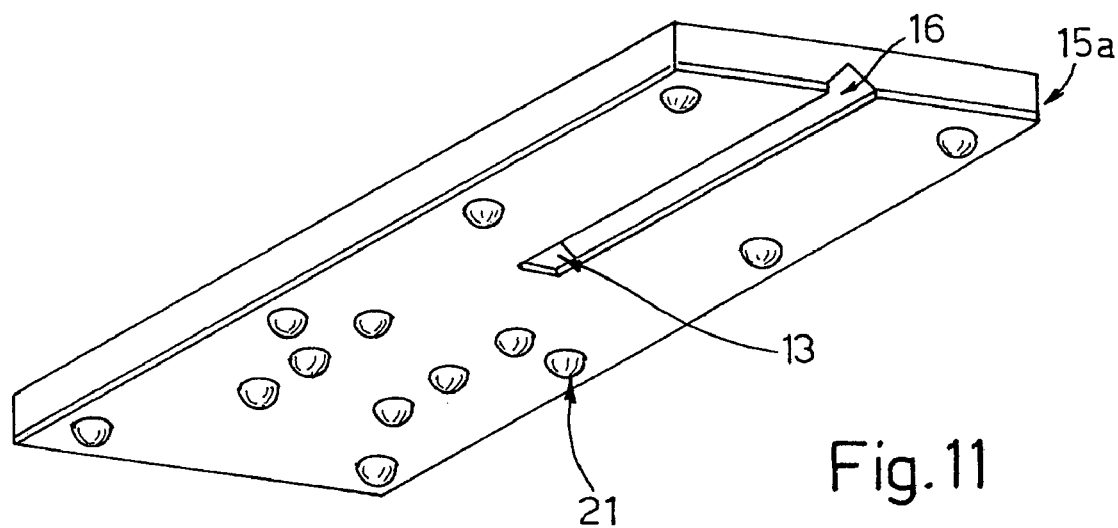

Then, welding balls of PbSn are welded, by remelting, to the rear contact regions 18, at a temperature of approximately 180° C., as illustrated in the perspective view from below of FIG. 10, thus forming bumps 21 forming a ball grid array (BGA).

Next, the composite wafer 15 is diced corresponding to the portions 15a, and the laser device 19 and the monitoring photodiode 20 are electrically connected to the corresponding pads 2d by wire bonding.

Figure 12:
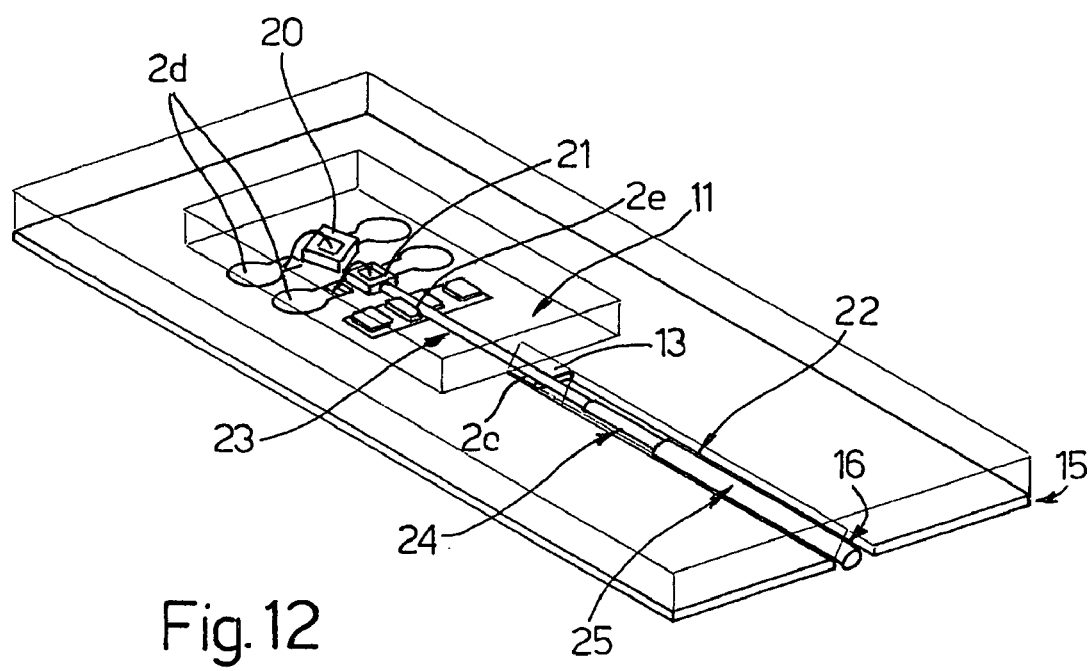

Then (FIG. 12), the end portion of an optical fiber 22, which has been previously lensed (i.e., processed using a chemical method to create a sort of "rounding" having the function of a lens so as to increase the light coupling efficiency) and metallized, is inserted in the channel 16 and in the pseudo-ferrule 14. The optical fiber 22 has a metal coated end 23, with a diameter of, for instance, 125 μm, a bare portion 24 adjacent to the metal coated end 23, with a diameter of, for instance, 125 μm, and a coated stretch 24 consecutive to the bare portion, with a diameter of, for instance, 205 μm. The length of the different portions is studied in such a way that the metal coated end 23 extends, after fixing, from the front face of the laser device 19 right into the channel 16, beyond the pseudo-ferrule 14, and the bare portion 24 extends completely within the channel 16, as will be explained in detail hereinafter.

The process of aligning the optical fiber 22 is carried out by supplying the laser device 19 with a current source connected to the pads 2d via the through contacts 4. Moving the end of the optical fiber 22 through micromanipulators (not illustrated), the position of maximum emitted power is sought; thereafter the optical fiber is fixed by heating the welding region 2e, through the resistor 3.

Figure 13:
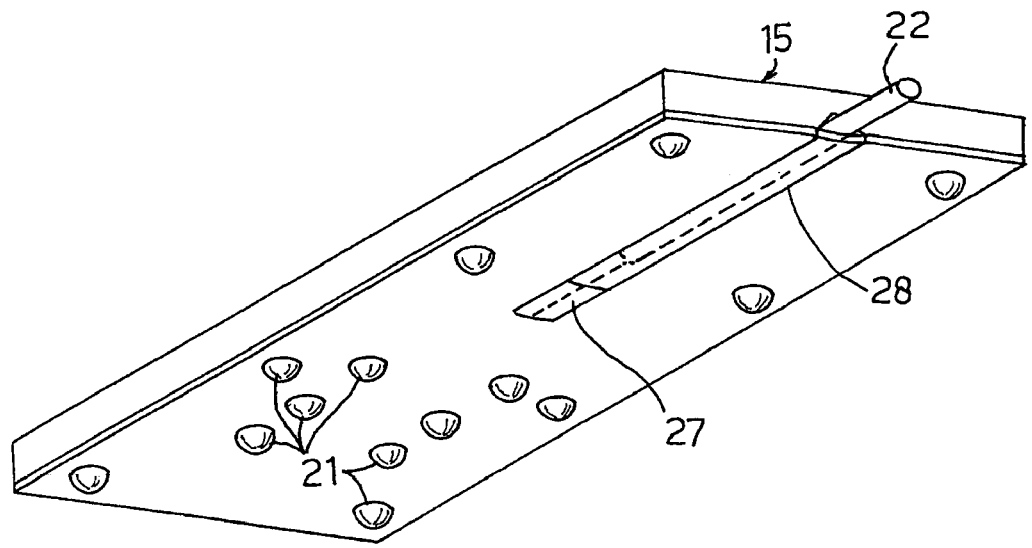

Next, the pseudo-ferrule 14 is hermetically sealed by a PbSn based pre-formed welding material introduced through the channel 16, as represented schematically in FIG. 13 by material 27. Then, the optical fiber 22 is fixed by some resin 28, which closes the channel 16 at the bottom, giving the end ("pigtail") of the optical fiber 22 the mechanical strength needed for handling.

Figure 14:
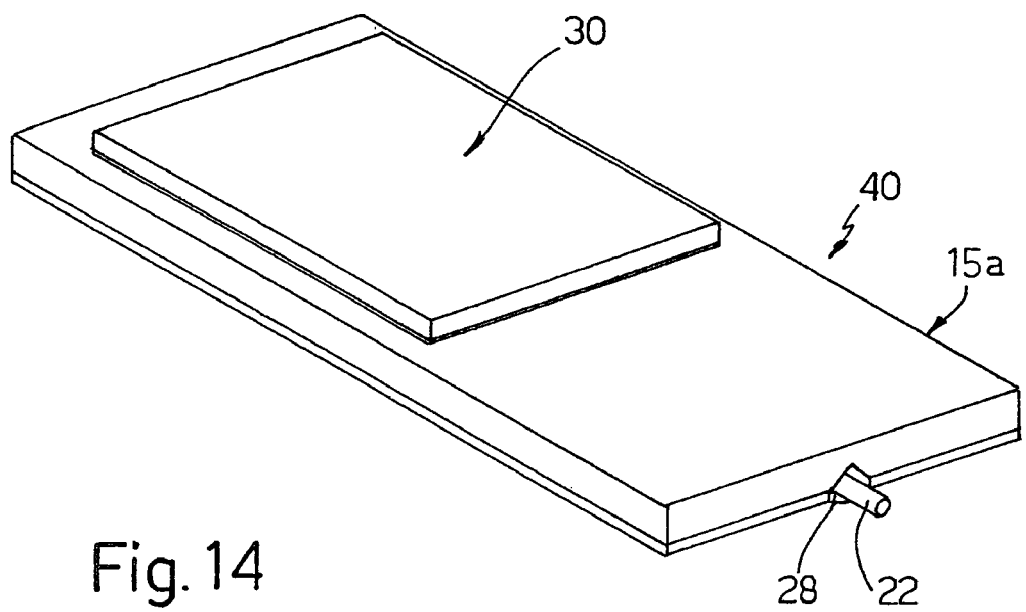

Finally (FIG. 14), a silicon cover 30 is welded on top of the portion 10a of the second wafer 10, thus hermetically sealing the opening 11. Also in this case, welding may be carried out according to any one of the techniques known to the person skilled in the art, for instance, by covalent bond welding, hermetically sealing a cavity formed by the window 11 and including the laser device 19 and the respective monitoring photodiode 20.

The device thus obtained has the following advantages. First, it solves the problems inherent to known solutions due the presence of two distinct systems (ceramic package and submount), by virtue of a single packaging system made of a same material (silicon).

The capability of silicon to be processed directly at a wafer level, even for wafers of considerable dimensions, enables sharing of the production process costs amongst the several hundred devices that may be obtained. Thanks to the combination of package, carrier submount and components, it is moreover possible to carry out both positioning and welding of the optoelectronic components (laser and photodiode) directly on one surface of the wafer and welding of the array of bumps on the opposite surface, thus reducing drastically the assembly costs.

The process of welding the optoelectronic transducers and the bumps directly on the wafer enables functional characterization of the laser to be carried out in conditions of thermal stress ("burn-in") directly on wafer level, drastically reducing, also in this case, the costs of selection according to the specifications imposed by the standards.

The use of a single material (silicon) for the construction of the package/submount system simplifies both mechanical design, which is not tied down by considerations related to the use of materials with different thermomechanical characteristics (ceramic for the package and silicon for the carrier submount), and assembly, since two stations are no longer required for manufacturing the optical subassembly on the carrier submount and for final packaging the carrier submount within the ceramic package. The present invention eliminates, in this latter step, also the problems deriving from mechanically connecting the package and the carrier submount, by bonding or welding.

The finished device, after dicing of the wafer, requires a single station where the optical fiber is aligned to the laser or photodiode, the optical fiber is fixed, and the silicon optoelectronic package thus obtained is finally sealed (through the silicon cover).

Since the resulting structure forms simultaneously both a hermetic sealing package and a substrate for assembling the laser and the photodiode and for aligning and fixing the end of an optical fiber coupled thereto, it has minimal overall dimensions. Consequently, the two transmitter and receiver subsystems form the constituent blocks of any type of standard (SDHISONET, GbE) for any application and bit rate in transmitter and receiver modules for optical fiber connections.

Since the packaging and supporting structure is made completely of silicon, instead of ceramic, it presents, in addition to the well-known properties of direct processability at a wafer level, also a higher thermal conductivity, which enables high efficiency in dissipating the heat generated by the active devices present in the structure, such as the laser (TX) or the circuit amplifying the photocurrent generated by the photodiode (RX). Moreover, the low thermal resistance offered by the silicon enables direct thermal connection of the packaging structure to cooling active devices, such as Peltier cells, which are indispensable in wavelength-division-multiplexing (WDM) applications.

The use of through paths of high electrical conductivity silicon and of welding balls for connecting the package to an external carrier structure enables the parasitic electrical parameters to be reduced to a minimum even at very high bit-rates ($\geq 10$ Gb/s). Consequently, in case of laser transmitter, the electronic driving circuit (laser driver), on. the outside of the package, can be connected using very short electrical lines with an extremely small absolute value of the electrical reflection parameter. For the receiver module, the first electronic amplification for the photocurrent generated by the photodiode (transimpedence amplifier) is also housed within the silicon package system in order to reduce the length of the wire connecting to the high input electrical impedance (which is thus more sensitive to disturbance) of the PIN or APD photodiode.

Finally, it is clear that modifications and variations may be made to the structure described herein, without departing from the scope of the present invention.

For example, should characteristics of hermetic sealing not be required, it is possible to resort to non-hermetic techniques for closing the channel 16 and/or to do without any cover. In addition, the type and number of devices to be mounted inside the window 11 may vary according to the specific application.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An encapsulated optoelectronic device, comprising:
    a first body, of semiconductor material, having a first and a second face;
    a second body, of semiconductor material, fixed to said first face of said first body;
    a through window formed in said second body and exposing a portion of said first face of said first body;
    at least one optoelectronic component fixed to said first body within said window;
    first through connection regions extending through said first body from said first to said second face and in electrical contact with said optoelectronic component;
    insulation regions surrounding said first through connection regions; and
    first contact regions extending on said second face of said first body and connected to said optoelectronic component through said through connection regions.

2. The device according to claim 1, wherein a cover of semiconductor material is bonded to said second body and hermetically closes said window.

3. The device according to claim 1, wherein said through window enables access to said at least one optoelectronic component from said fourth face of said second body.

4. The device according to claim 1, wherein at least a section of said first body extending from said first face to said second face consists essentially of said semiconductor material of said first body.

5. The device according to claim 1, wherein said at least one optoelectronic component is fixed directly to said first body within said through window.

6. The device according to claim 5, wherein said at least one optoelectronic component is not fixed directly to said second body.

7. The device according to claim 1, wherein said second body has a fiber housing groove extending from a side surface external to said window for housing an optical fiber.

8. The device according to claim 7, wherein said optoelectronic component comprises a laser device facing one end of said optical fiber.

9. The device according to claim 7, comprising a resistive region extending on said first face of said first body and carrying welding material, said resistive region being connected to second contact regions formed on said second face via second through connection regions.

10. The device according to claim 7, wherein said first body has a first metal region, and said fiber housing groove has a second metal region arranged next to said window, at least partially facing said first metal region and forming with said first metal region a pseudo-ferrule.

11. The device according to claim 10, wherein metal material is housed in and hermetically seals said pseudo-ferrule.

12. The device according to claim 7, wherein said first body has a through channel facing said groove and forming a prolongation of said groove.

13. The device according to claim 12, wherein said through channel is closed with sealing material.

* * * * *